United States Patent [19]
Gray et al.

[11] Patent Number: 6,090,200
[45] Date of Patent: Jul. 18, 2000

[54] NANOPARTICLE PHOSPHORS MANUFACTURED USING THE BICONTINUOUS CUBIC PHASE PROCESS

[76] Inventors: Henry F. Gray, 1013 Dalebrook Dr., Alexandria, Va. 22308; Jianping Yang, 3466 S. Pinnit Pl., Boise, Id. 83706; David S. Y. Hsu, 8718 Parry La., Alexandria, Va. 22308; Banhalli R. Ratna, 8928 Applecross La., Springfield, Va. 22153; Syed B. Qadri, 8501 Oak Point Way, Fairfax Station, Va. 22032

[21] Appl. No.: 08/972,402

[22] Filed: Nov. 18, 1997

[51] Int. Cl.[7] .................................................... C30B 7/00
[52] U.S. Cl. ............................ 117/68; 430/135; 438/63
[58] Field of Search ....................... 117/11, 68; 427/157; 252/301.6 R, 301.6 S; 430/135; 257/102, 103; 428/323, 402, 690; 438/34, 46, 63; 424/400, 484, 486

[56] References Cited

U.S. PATENT DOCUMENTS

| | | | |
|---|---|---|---|
| 4,898,981 | 2/1990 | Falk et al. | 568/28 |
| 5,238,613 | 8/1993 | Anderson | 264/425 |
| 5,446,286 | 8/1995 | Bhargava | 250/361 |
| 5,455,489 | 10/1995 | Bhargava . | |
| 5,525,377 | 6/1996 | Gallagher et al. | 427/512 |
| 5,882,779 | 3/1999 | Lawady | 428/323 |

OTHER PUBLICATIONS

Yang, J.P. et al., "Structural and morphological characterization of PbS nanocrystallites synthesized in the bicontinuous cubic phase of a lipid", J. Physical Chemistry, vol. 100, No. 43: 17255–17259, 1996.

*Primary Examiner*—Felisa C. Hiteshew
*Assistant Examiner*—Donald L. Champagne
*Attorney, Agent, or Firm*—Barry A. Edelberg; Romulo H. Delmendo

[57] ABSTRACT

Nanocrystalline phosphors are formed within a bicontinuous cubic phase. The phosphors are doped with an optimum concentration, of manganese, for example, corresponding to about one or less dopant ions per phosphor particle.

16 Claims, 2 Drawing Sheets

NANOPARTICLE PHOSPHORS MANUFACTURED USING THE BICONTINUOUS CUBIC PHASE PROCESS

BACKGROUND OF THE INVENTION

1. Field of the Invention

The present invention relates to generally to phosphors and more specifically to the production of nanoparticulate phosphors.

2. Description of the Background Art

There is a resurgence in phosphor research due to the recent interest in developing emissive flat panel displays, e.g. full-color low-voltage field emitter displays (FEDs), large area plasma displays (PDs), and electroluminescent displays (ELDs). For example, to make low-voltage FEDs, decreasing the required electron energy by two orders of magnitude from the 30 KV range of CRTs while maintaining significant light output is quite challenging. In low-voltage FEDs, the incident electron mean free path in the phosphor is extremely short, and some researchers feel that the photon generation process should occur reasonably close to the electron-hole pair creation point to avoid non-radiative recombination at nearby defects. Furthermore, there is the belief that present day micron size phosphors are surrounded by a dead layer of defective material whose thickness is comparable to or greater than the mean free path of low energy electrons used in low voltage FEDs. The defects in this surface layer, which are produced, for example, by ball milling and other harsh surface (and bulk) defect producing processes, are believed to be non-radiative recombination centers. These result in low optical output when these phosphors are bombarded by low energy electrons.

Research interest in the general field of nanoscale materials has been growing fast. New methods of developing nanoparticles are being developed, and their novel physical properties are being studied. For example, in Yang et al., U.S. Ser. No. 08/841,957, filed Apr. 7, 1997, nanocrystalline semiconductor particles are produced within the mesoporous cavities of a bicontinuous cubic phase. The cavities contain at least one of the reactants required to form the semiconductor compound. Any other required reactants are diffused into the mesoporous cavities.

SUMMARY OF THE INVENTION

Accordingly, it is an object of the present invention to provide phosphors having a high light output level.

It is another object of the present invention to provide nanocrystalline phosphors that have no or few bulk defects.

These and additional objects of the invention are accomplished by forming doped nanocrystalline semiconductor particles within the mesoporous cavities of a bicontinuous cubic phase. The cavities contain at least one of the reactants required to form the semiconductor compound. Any other required reactants are diffused into the mesoporous cavities. Doped nanocrystals are produced by diffusing dopant or activation ions into the mesoporous cavities along with the other reactants or by including dopant or activation ions within the mesoporous cavities of the BCP under conditions such that the nanoparticles are doped with an average of one or less dopant ions per particle. For the purposes of the present specification and claims, the words "dopant" and "activator" are used interchangeably to describe the ion that, when placed within the interior of a nanocrystalline particle, provides the particles with phosphorescence.

BRIEF DESCRIPTION OF THE DRAWINGS

A more complete appreciation of the invention will be readily obtained by reference to the following Description of the Preferred Embodiments and the accompanying drawings in which like numerals in different figures represent the same structures or elements, wherein.

DESCRIPTION OF THE PREFERRED EMBODIMENTS

Figure 1:
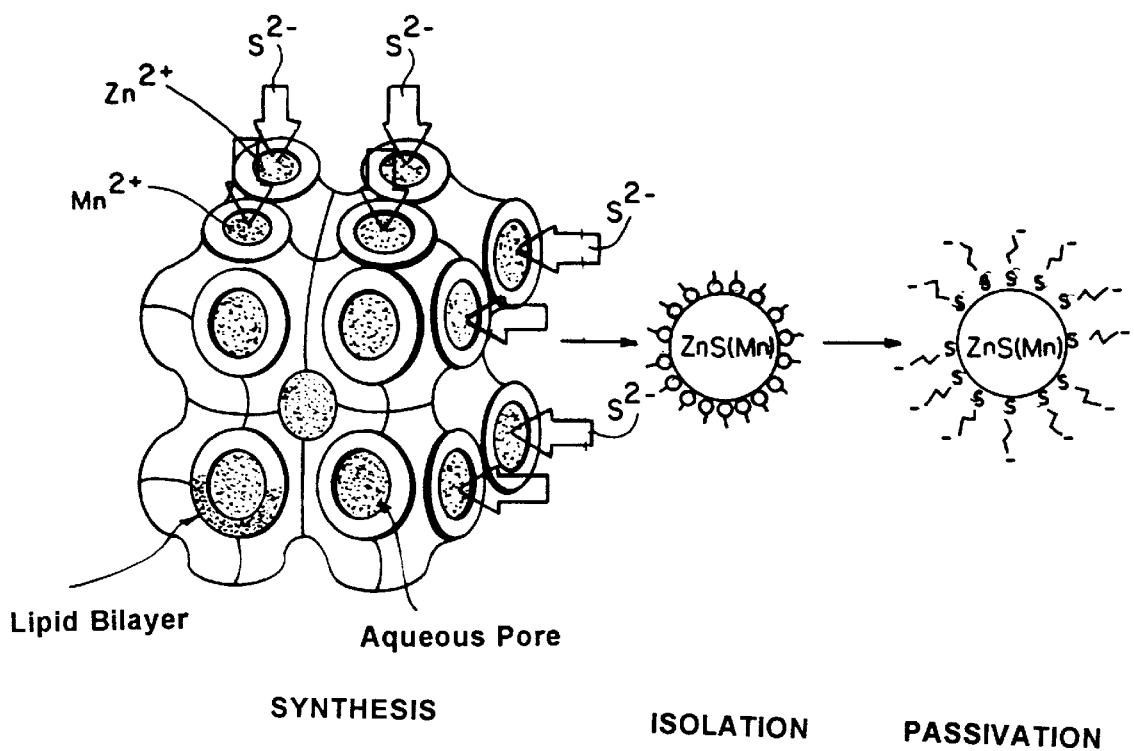
FIG. 1 is a schematic representation of the synthetic approach used in the method of the present invention.

The present invention is based upon the availability of stable mesoporous structure provided by Bicontinuous Cubic Phase (BCP) of lipids in the temperature range of 20–100° C. The formation of nanoparticulate materials is achieved by chemical reactions among precursors which are either all or in part embedded within the cubic matrix, or by physical transportation of one or more of the precursors from the outside environment into the mesoporous structure. The size of the grown crystals is limited by the size of the pores in the matrix and/or by chemical termination achieved by the limited amount precursor(s) available within the matrix. The solubility of surfactant in wide variety of solvents facilitates simple isolation and purification of formed nanoparticles from surfactant and remnant precursor chemicals. The stoichiometric composition of the nanoparticle can be controlled very accurately via the relative concentration of the precursor ions.

Nanoparticle phosphors solve both the bulk defect and surface dead layer non-radiative recombination problems. Many features associated with phosphor particles of 1–30 nm, and more often 2–10 nm size are truly unique and superior to conventional micron-size phosphor particles. Nanocrystalline phosphors are believed to have a more perfect lattice, and thus fewer bulk defects, as compared to conventional micron size phosphor particles. Lastly, emission studies of nanoparticle phosphors appear to indicate that the intrinsic luminescence efficiency of doped phosphors can be drastically improved by reducing the particle size to nanometer dimensions.

The invention allows for a very narrow size distribution and physical particle isolation, and allows one to obtain well isolated activator ions which emit the visible light. That is, the present invention provides nanoparticles having an average of just one activator ion per nanoparticle phosphor grain. Self-assembled three dimensional structures which are comprised of mesoporous cavities are used for this purpose.

Any combination of surfactant and liquid hydrophilic phase, at any ratio that produces a bicontinuous cubic phase, may be employed. As stated earlier, the formation of bicontinuous phases has been well characterized in the prior art. Thus, the specifics of forming the bicontinuous phase will not be discussed here.

Bicontinuous cubic phases include mesoporous cavities that are interconnected by channels. The cells and the channels interconnecting the cells are filled with the liquid hydrophobic phase. In the present application, the liquid hydrophilic phase is typically exemplified by an aqueous phase. Another liquid hydrophilic phase such as ethanol or methanol, however, may be used in place of an aqueous phase according to the present invention. Thus, unless otherwise stated, teaching in the present application relating to the use of an aqueous phase are applicable to the use of any liquid hydrophilic phase used in place of an aqueous phase.

The size of the mesoporous cavities in a bicontinuous cubic phase is controlled, in an art-known and recognized manner, by selection and concentrations of the aqueous (or non-aqueous) phase and surfactant. Typically, mesoporous cavities (aka "pores") in a bicontinuous cubic phase have a diameter of about 2 nm to about 30 nm, and more often about 2.5 to about 10 nm. Of course, the only upper limit on the size of the mesoporous cavities useful in the method of the present invention is that they must be sufficiently small to restrict the diameter of semiconductor particles grown therein to about 30 nm or less. Therefore, bicontinuous cubic phases having mesoporous cavities as large as about 30 nm are useful according to the present invention.

Surfactants used to form the BCP structure have at least one long chain ($C_8$ or above) hydrophobic (typically alkyl) chain and at least one polar head group. These surfactants may be glycerated or non-glycerated, and may be nonionic, amphoteric, anionic, or cationic. These surfactants may also be lipids. Some typical surfactants useful in forming bicontinuous cubic phases include sodium diethyl hexylsulphosuccinate (AOT), potassium octanoate, decyltrimethylammonium chloride, dodecyltrimethylammonium chloride and mono-1-olein hexadecyllysophosphatidylcholine.

The reactants used to form the semiconductor particles should be soluble in the phase (i.e., hydrophobic chain of the surfactant, the aqueous phase of a non-inverted bicontinuous cubic phase, or the non-aqueous phase of an inverted bicontinuous cubic phase) which fills the pores of the bicontinuous cubic phase, and should react, in solution, to form semiconductor particles that are insoluble in the pores of the bicontinuous cubic phase.

To form semiconductor particles according to the method of the present invention, at least one of the reactants required to form the semiconductor compound, but less than all of the required reactants, are usually included in the surfactant or aqueous phase used to make the bicontinuous cubic phase, so that the latter formed bicontinuous cubic phase includes that at least one reactant in solution within its pores. The remaining required reactants are then diffused into the pores of the bicontinuous cubic phase. Once these remaining materials diffuse into the pores, they react with the at least one reactant to form the desired semiconductor particles.

Alternatively, the at least one required reactant, but less than all the required reactants, are initially diffused into the pores of a preformed bicontinuous cubic phase. After this initial diffusion has completed, the remaining reactants are diffused into the pores, where they react with the reactant(s) previously diffused into the pores, thus forming semiconductor particles. Most semiconductor compounds are binary compositions, for example II–IV and IV–VI semiconductors. Typically, binary semiconductors compositions are readily formed by reacting two reactants. In these cases, one of the reactants is within the pores before the other reactant is diffused into the pores. Some binary semiconductor nanocrystals that can be made according to the present invention include doped semiconductors such as PbS, CdS, PbSe, CaS, SrS, and ZnS.

In another alternative, all the reactants may be placed within either the aqueous phase or the surfactant, and the temperature of the aqueous phase and/or surfactant maintained below the reaction temperature until after mixing the aqueous phase (or non-aqueous phase) and surfactant to form the bicontinuous cubic phase.

The choice of which reactant(s) is provided in the bicontinuous cubic phase either during formation of the phase or during initial diffusion depends upon the diffusion characteristics of the reactants, and may vary depending upon the selection of the surfactant. Preferably, the reactants that diffuses slowest through bicontinuous cubic phase are the reactants initially present inside the pores. Otherwise, a substantial loss in yield may occur during diffusion of the final reactants into the bicontinuous cubic phase, since the initial reactants will be diffused out of the pores as the final reactants are diffusing in. Persons skilled in the art can predict the diffusion characteristics of many compounds for a variety of surfactants. Thus, the selection of appropriate combinations of solvents, reactants, and surfactants to form semiconductor nanoparticles of a specified composition should not be difficult. The reactants used to form the nanocrystalline semiconductor particles according to the present invention are generally either negatively or positively charged ions that react with at least one oppositely charged ionic reactant to form the desired semiconductor compound. Dopant/activator ions may also be provided in the matrix in the same manner as the reactants, i.e., either by diffusion or by inclusion in the solvents and/or surfactants mixed to form the bicontinuous cubic phase.

To form phosphors, the dopant ion should be an activator ion that possesses a high level empty state and a lower level empty state, both of which are within the bandgap of the host semiconductor material. Upon excitation, which may occur from exposure to kinetic (e.g., collision with a high energy subatomic particle) thermal, chemical, electrical, or electromagnetic energy (e.g., visible, u.v., or ionizing radiation) depending upon the combination of host and dopant, the excited electrons populate the upper level of the host material. A radiative transition from such a localized higher energy level to a lower empty level in the same activator ion is characterized by the emission of visible light. The dopants are typically transition metals or rare earth metals that act as the luminescent centers or phosphorescent centers. A number of different activator ions in different host materials have been measured. For example, Mn-doped ZnS is known to emit in the 580 nm range, whereas copper (or terbium) and silver doping will result in green and blue emission respectively.

Once the reactants have formed the doped semiconductor compound, the bicontinuous cubic phase is dissolved in solvent that in which the doped semiconductor compound is insoluble. The doped semiconductor nanoparticles may then subjected to a final wash in a solution including a passivating compound that serves as an antiagglomeration agent. The passivating compound is a long chain hydrocarbon Y—R—SH, where R is a hydrocarbon carbon chain of at least two, and typically three or more, carbons and Y is a hydrophobic or hydrophilic end group, depending upon the dispersing solvent (i.e., hydrophobic for non-aqueous dispersants, and hydrophilic for aqueous dispersants). Typical Y groups include alkyl groups, —COOH, —OH, —SH and

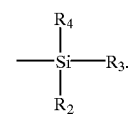

where $R_2$, $R_3$, and $R_4$ may be the same or different and are ethyl or methyl. These antiagglomeration agents attach to the surface of the nanoparticles and protect them from agglomeration and reaction with the environment, for example, air. Semiconductor compounds passivated with compounds having Y=—SH have the potential to organize into new and interesting structures.

Of course, the reactants and materials used should be as free as possible of potential impurities that might significantly reduce the usefulness of the semiconductor nanocrystals produced according to the present invention as nanocrystalline semiconductor phosphors. The stoichiometric composition of the nanoparticle with respect to the dopant ion can also be controlled very accurately via the relative concentration of the precursor ions, as shown the accompanying examples.

Typical dopants/activators used in the present invention include Mn; Cu; Ag; Eu; Cu,Cl; Cu,Tb; Tb; Ag,Cl; Cl; Cu,Al; Ce; Er; Er,Cl; Zn. Where the dopant/activator is a mixture, such as Cu,Cl, some nanoparticles are doped with Cu, while other nanoparticles are doped with Cl. Typical hosts include ZnS, ZnO, CaS, SrS, $Zn_xCd_{1-x}S$, $Y_2O_2$, $Y_2O_2S$, $Zn_2SiO_4$, $Y_3Al_5O_{12}$, $Y_3(AlGa)_5O_{12}$, $Y_2SiO_5$, LaOCl, $InBO_3$, $Gd_2O_2S$, $ZnGa_2O_4$, yttrium niobate, TAG and YAGAG.

Some examples of host-activator/dopant pairs according to the method of the present invention include: ZnS:Mn; ZnS:Cu,Mn; ZnS:Cu; ZnS:Ag; ZnS:Cu,Cl; ZnS:Eu; ZnS:Cu,Tb; ZnS:Tb; ZnS:Ag,Cl; ZnS:Cu,Al; $Zn_xCd_{1-x}$S:Mn; $Zn_xCd_{1-x}$S:Ag,Cl; $Zn_xMg_{1-x}$S:Mn; SrS:Mn; SrS:Ce; CaS:Mn; CaS:Er,Cl; CaS:Tb; and ZnO:Zn. Other possible phosphors that may be made according to the present invention include: ZnS:Cu.Mn; ZnS:Cu; ZnS:Ag; ZnS:Cu, Cl; ZnS:Eu; ZnS:Cu,Tb; ZnS:Tb; ZnS:Ag,Cl; ZnS:Cu,Al; $Zn_xCd_{1-x}$S:Mn; $Zn_xCd_{1-x}$S:Ag,Cl; $Zn_xMg_{1-x}$S:Mn; SrS:Mn; SrS:Ce; CaS:Mn; CaS:Er,Cl; CaS:Tb.

Having described the invention, the following examples are given to illustrate specific applications of the invention including the best mode now known to perform the invention. These specific examples are not intended to limit the scope of the invention described in this application.

EXAMPLES

Example 1
Synthesis of ZnS:Mn Nanoparticles

Nanoparticles of zinc sulfide doped with manganese (ZnS:Mn) were prepared at room temperature in the BCP of a surfactant/water system. The nanoparticles were purified, isolated, and surface passivated (See FIG. 1) to prevent agglomeration. They were found to be highly stable under a 200 keV electron beam of a transmission electron microscope (TEM). The TEM micrographs showed the particles to have a size in the 2–3 nm range and were monodispersed. The average particle size (2.5±0.5 nm) determined from x-ray diffraction studies agreed well with the TEM measurements. From high resolution TEM studies, it was determined that the nanoparticles were monocrystalline with a zinc-blended cubic lattice.

Example 2
Photoluminescence Studies

Figure 2:
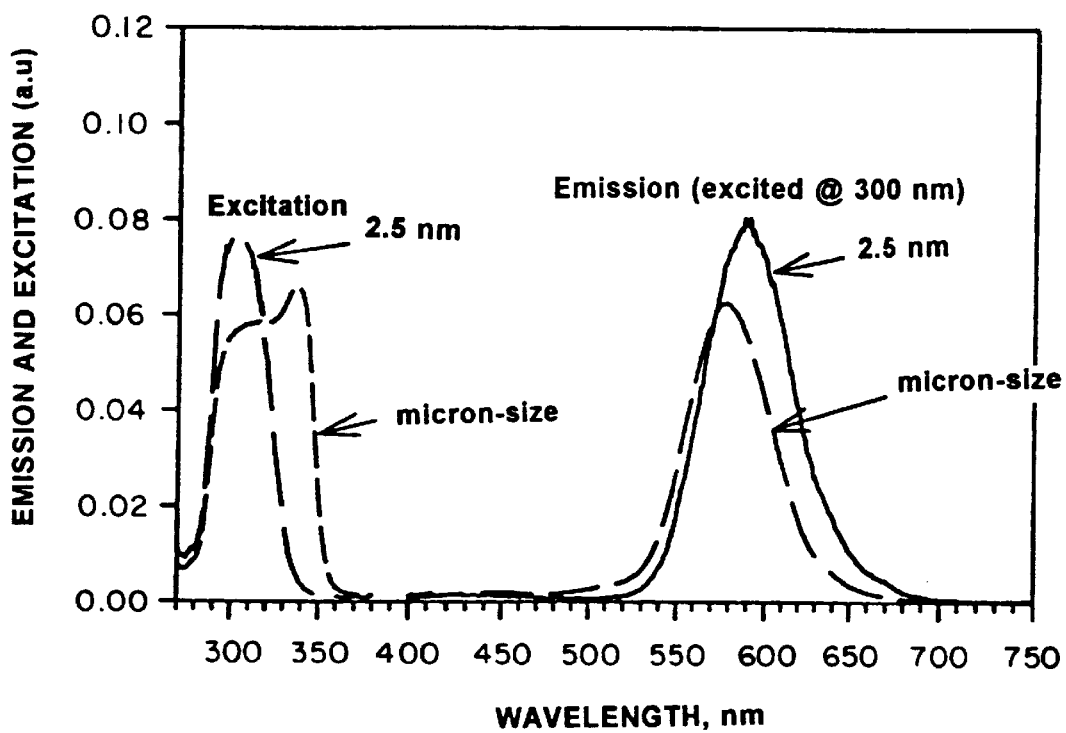
FIG. 2 is a comparison of the excitation and emission spectra of a nanocrystalline sample with a bulk reference.

Excitation and emission spectra, measured using a fluorimeter, were compared with that of a 'bulk' sample, as shown in FIG. 2. The excitation peak from the nanoparticle phosphor, centered at about 300 nm (4.1 eV), was found to be narrower (25 nm or ~0.32 eV) and blue shifted compared to the bulk micron size particle phosphor, due to the quantum confinement. On the other hand, the emission peak showed a slight red shift with decreasing particle size. This red shifting of the emission peak might be due to a distortion of the nanoparticle lattice, the creation of a slight compression or relaxation of the lattice, and/or a change in the unit cell volume. Interestingly, absorption measurements (not shown) indicate that the $Mn^{2+}$ absorption peaks appear relatively unaffected by the nanocrystalline environment.

Example 3
Effect of Manganese Concentration on Quantum Yield

Figure 3:
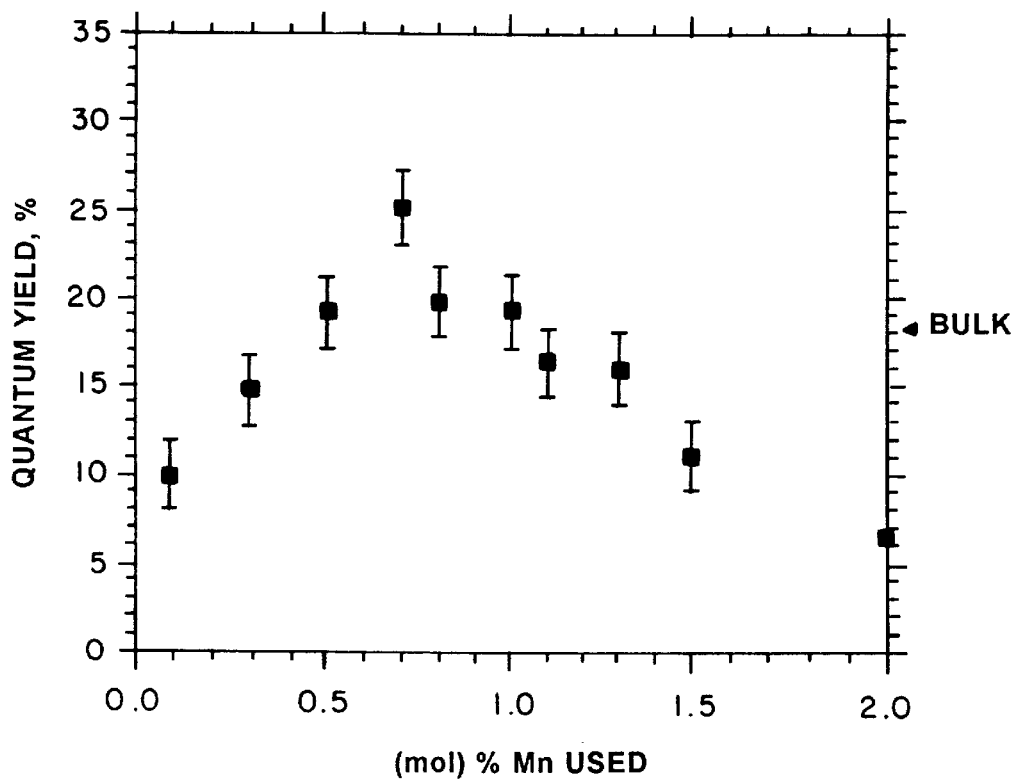
FIG. 3 show the dependance of quantum yield on the manganese salt concentration. A freshly made Rhodamine-B solution was used as a calibration standard.

Using the BCP process, a number of ZnS:Mn nanoparticle samples were prepared by varying the Mn/Zn molar ratio in the initial salt solution. The quantum yield, measured as a function of Mn concentration in the initial solution, FIG. 3, shows that the photoluminescent efficiency is maximum at about 0.7 mole %. EPR studies (discussed below) indicate that at this maximum efficiency, the effective doping level is about one manganese atom per nanoparticle.

Example 4
Electroparamagnetic Resonance Studies

Figure 4:
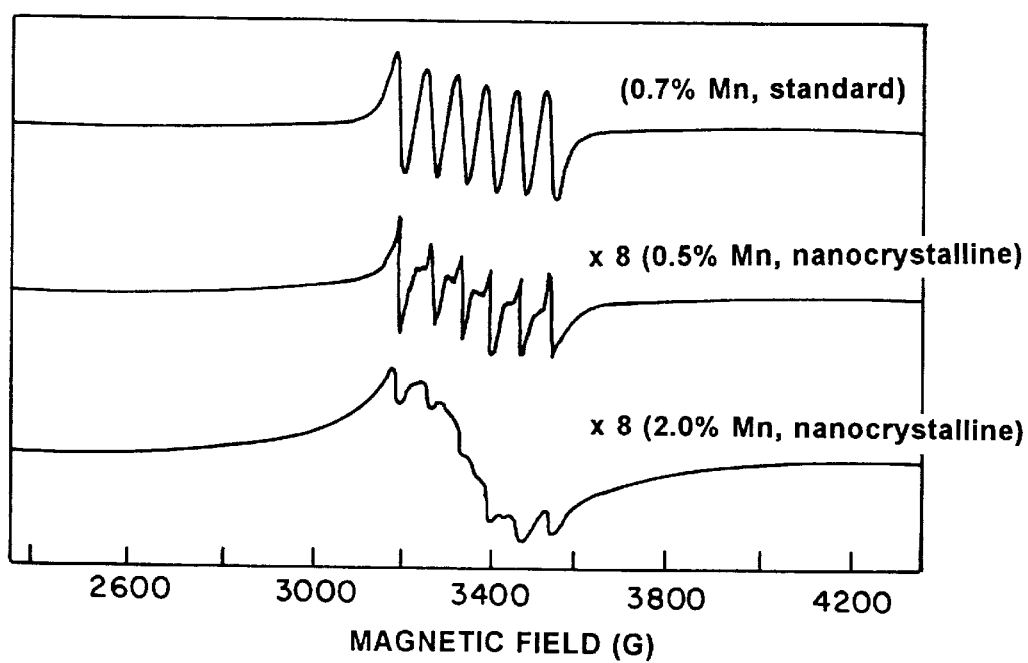
FIG. 4 shows is an EPR spectra taken at 10 $\mu$W and at 20 K for nanocrystals doped with 0.5 and 2.0 mole % manganese. Also, shown at the top is the spectrum taken for the reference standard.

Electron paramagnetic resonance (EPR) studies were performed on the ZnS:Mn samples discussed above in Examples 1 through 3. EPR spectra for three representative samples are shown in FIG. 4. The spectra for manganese concentrations at and below 0.5% manganese doping, e.g. the middle curve, show the six-line hyperfine structure of isolated $Mn^{2+}$ ions. The hyperfine spectrum is due to interactions of the unpaired and isolated Mn electrons with the nuclear spin of the Mn nucleus. Mn has a nuclear spin, I, of 5/2, resulting in a six-line hyperfine spectrum.

At high Mn concentrations (see the spectrum with 2% Mn), the smearing of the hyperfine lines and the presence of the broad underlying structure indicates that the interactions between neighboring $Mn^{2+}$ ions is significant (Y. Ishihara, *J. Phys. Soc. Jpn.*, 21, 1473 (1966);. J. Kreissl, *Phys. Stat. Sol. A*, 97, 191(1986)). And this Mn-Mn interaction decreases the photo efficiency as shown in FIG. 3.

The presence of a broad underlying structure in the middle spectrum of FIG. 4, though not as significant as for the 2% sample, is indicative of the existence of exchange coupled $Mn^{2+}$ ions in this sample also. In other words, even at 0.5% Mn (based on the total number of Zn ions) loading many of the Mn atoms are not isolated from each other and as such are not participating as efficient visible light emitters. These results suggest that these exchange coupled Mn pairs might be located outside the nanoparticles, perhaps on the surface of the nanoparticles, and their existence might even be a channel for non-radiative recombination. In fact, this data, coupled with the fact that the photoluminescence is maximum at this Mn concentration suggests that in each ZnS nanoparticle there is, on the average, one or less than one isolated Mn ion.

In summary of the results obtained in the Examples, the recently developed room temperature bicontinuous cubic phase (BCP) process was modified to synthesize uniformly small ZnS:Mn nanoparticles. The size of these nanoparticles was about 2.5±0.5 nm. Optical absorption and photoluminescence measurements confirmed an increased band-gap as a result of the quantum-size effect. Quantum yield measurements on ZnS nanoparticles as a function of Mn doping concentration coupled with EPR measurements suggest that only those nanoparticles doped with one isolated Mn atom contribute to the photoluminescence.

Another unique advantage of the nanoparticles according to the present invention is that they are not only photoluminescent, but they can also be cathodoluminescent and electroluminescent. The ability of nanoparticles according to the present invention to have these various forms of luminescence allows one particle to be used for several distinct applications. This versatility simplifies the design and production of luminescent displays and provides for improved economy of scale.

Obviously, many modifications and variations of the present invention are possible in light of the above teachings. It is therefore to be understood that, within the scope of the appended claims, the invention may be practiced otherwise than as specifically described.

What is claimed is:

1. A method of producing monodispersed doped nanocrystalline phosphors, said doped phosphors comprising a compoinid formed as the reaction product of two or more reactants, comprising the steps of:

forming a bicontinuous cubic phase including interconnected mesoporous cavities, said mesoporous cavities housing at least one and less than all of said reactants from which said compound is formed, said bicontinuous cubic phase being nonreactive with respect to all of said reactants;

diffusing the remainder of said reactants into said mesoporous cavities;

allowing said reactants to react, within said mesoporous cavities and in the presence of a dopant ion, to form doped nanocrystalline phosphors, said mesoporous cavities being of a diameter that limits the size of said doped nanocrystalline phosphors formed therein to no greater than about 30 nm in diameter, the concentration of said dopant during said formation of said doped nanocrystalline phosphors being such that said formed doped nanocrystalline phosphors have an average of about one or less dopant ions per nanocrystallinc phosphor particle.

2. The method of claim 1, wherein said dopant ion is a transition metal ion.

3. The method of claim 1, wherein said bicontinuous cubic phase is formed by mixing a surfactant with a liquid hydrophilic phase in a ratio effective to form said bicontinuous cubic phase, and wherein at least one of said surfactant and said liquid hydrophilic phase includes, before mixing, said one of said reactants.

4. The method of claim 3, wherein said at least one of said liquid hydrophilic phase includes said one of said reactants.

5. The method of claim 3, wherein said surfactant is a lipid.

6. The method of claim 5, wherein said mesoporous cavities of said bicontinuous cubic phase are bounded by surfactant bilayers.

7. The method of claim 1, wherein said mesoporous cavities of said bicontinuous cubic phase have diameters of about 2–10 nm.

8. The method of claim 1, wherein said compound is a II–VI semiconductor.

9. The method of claim 1, wherein said all of said reactants are ions in solution.

10. The method of claim 1, wherein one of said mesoporous cavities include a dopant ion during the reaction of said reactants, so that said reactants form a doped semiconductor compound.

11. The method of claim 1, further comprising the steps of:

recovering said doped nanocrystalline phosphors by dissolving said bicontinuous cubic phase in a solvent in which said doped nanocrystalline phosphors are insoluble.

12. The method of claim 11, further comprising the step of washing said recovered doped nanocrystalline phosphors in a solution of an antiagglomeration agent that attaches to said phosphors.

13. The method of claim 12, wherein said antiagglomeration agent is Y—R—SH, where R is a hydrocarbon carbon chain of at least two carbons and Y is a hydrophobic or hydrophilic end group.

14. The method of claim 13, wherein Y is selected from the group consisting of alkyl groups, —COOH, —OH, —SH and

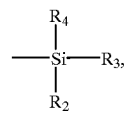

and wherein $R_2$, $R_3$, and $R_4$ may be the same or different and selected from the group consisting of ethyl and methyl.

15. A method of producing doped monodispersed nanocrystalline phosphors, said phosphors comprising a compound formed as the reaction product of two or more reactants, comprising the steps of:

forming a bicontinuous cubic phase including interconnected mesoporous cavities, said mesoporous cavities housing all of said reactants from which said compound is formed, said bicontinuous cubic phase being nonreactive with respect to all of said reactants;

allowing said reactants to react, within said mesoporous cavities and in the presence of a dopant, to form doped nanocrystalline phosphors, said mesoporous cavities being of a diameter that limits the size of said nanocrystalline phosphors formed therein to no greater than about 30 nm in diameter, the concentration of said dopant during said formation of said nanocrystalline phosphors being such that said formed doped nanocrystalline phosphors have an average of about one or less dopant ions per nanocrystalline phosphor particle.

16. A method of producing monodispersed doped nanocrystalline phosphors, said phosphors comprising a compound formed as the reaction product of two or more reactants, comprising the step of reacting all of said reactants, within mesoporous cavities of a bicontinuous cubic phase and in the presence of a dopant ion, to form monodispersed doped nanocrystalline doped phosphors, said mesoporous cavities being of a diameter that limits the size of said nanocrystalline phosphors formed therein to no greater than about 30 nm, said bicontinuous cubic phase being nonreactive with respect to all of said reactants, the concentration of said dopant during said formation of said doped nanocrystalline phosphors being such that said formed doped nanocrystalline phosphors have an average of about one or less dopant ions per nanocrvstalline phosphor particle.

* * * * *